(12) United States Patent
Ping et al.

(10) Patent No.: US 11,871,562 B2
(45) Date of Patent: Jan. 9, 2024

(54) METHOD FOR FORMING STORAGE NODE CONTACT STRUCTURE AND SEMICONDUCTOR STRUCTURE

(71) Applicant: CHANGXIN MEMORY TECHNOLOGIES, INC., Hefei (CN)

(72) Inventors: Erxuan Ping, Hefei (CN); Zhen Zhou, Hefei (CN); Lingguo Zhang, Hefei (CN); Weiping Bai, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 120 days.

(21) Appl. No.: 17/522,281

(22) Filed: Nov. 9, 2021

(65) Prior Publication Data

US 2022/0208772 A1 Jun. 30, 2022

Related U.S. Application Data

(63) Continuation of application No. PCT/CN2021/109291, filed on Jul. 29, 2021.

(30) Foreign Application Priority Data

Dec. 30, 2020 (CN) .......................... 202011605353.6

(51) Int. Cl.
*H01L 21/02* (2006.01)
*H10B 12/00* (2023.01)
*G11C 5/06* (2006.01)

(52) U.S. Cl.
CPC .......... *H10B 12/485* (2023.02); *G11C 5/063* (2013.01); *H01L 21/02532* (2013.01);
(Continued)

(58) Field of Classification Search
CPC ......... H01L 21/02639; H01L 21/02609; H01L 21/02532; H01L 21/02595;
(Continued)

(56) References Cited

U.S. PATENT DOCUMENTS 10,665,592 B2 5/2020 Song et al.
10,797,056 B2 10/2020 Kim et al.
(Continued)

FOREIGN PATENT DOCUMENTS

CN 103456694 B 9/2017
CN 210926003 U * 7/2020 ....... H01L 21/76882
(Continued)

*Primary Examiner* — Julio J Maldonado
*Assistant Examiner* — Sandra Milena Rodriguez Villanu
(74) *Attorney, Agent, or Firm* — Cooper Legal Group, LLC

(57) ABSTRACT

A method for forming a storage node contact structure and semiconductor structure are provided. The method includes providing a substrate having a surface on which bit line structures are formed; forming a groove at a part, corresponding to an active region, of bottom of the contact hole; and growing a silicon crystal from the groove in the contact hole by using an epitaxial growth process, and controlling growth rates of the silicon crystal in a first and second directions in a growth process to enable the growth rate of the silicon crystal in the first direction to be greater than the growth rate of the silicon crystal in the second direction at beginning of growth and enable the growth rate of the silicon crystal in the first direction to be equal to the growth rate of the silicon crystal in the second direction at end of the growth.

16 Claims, 8 Drawing Sheets

(52) U.S. Cl.
CPC .. *H01L 21/02595* (2013.01); *H01L 21/02598* (2013.01); *H10B 12/482* (2023.02); *H01L 21/02609* (2013.01)

(58) Field of Classification Search
CPC ............ H01L 21/02598; H10B 12/485; H10B 12/482; H10B 12/0335; G11C 5/063
See application file for complete search history.

(56) References Cited

U.S. PATENT DOCUMENTS

| | | | |
|---|---|---|---|
| 2015/0126013 A1* | 5/2015 | Hwang | H10B 12/315 438/672 |
| 2019/0164975 A1 | 5/2019 | Song et al. | |
| 2019/0363009 A1* | 11/2019 | Joe | H01L 29/66795 |
| 2020/0203347 A1 | 6/2020 | Song et al. | |
| 2020/0203348 A1 | 6/2020 | Kim et al. | |

FOREIGN PATENT DOCUMENTS

| | | |
|---|---|---|
| KR | 20060079608 A | 7/2006 |
| KR | 20110132753 A | 12/2011 |

\* cited by examiner

METHOD FOR FORMING STORAGE NODE CONTACT STRUCTURE AND SEMICONDUCTOR STRUCTURE

CROSS-REFERENCE TO RELATED APPLICATION

This application is a continuation of International Patent Application No. PCT/CN2021/109291, filed on Jul. 29, 2021, which is based on and claims priority to Chinese Patent Application No. 202011605353.6, entitled "METHOD FOR FORMING STORAGE NODE CONTACT STRUCTURE AND SEMICONDUCTOR STRUCTURE" and filed on Dec. 30, 2020. The disclosures of International Patent Application No. PCT/CN2021/109291 and Chinese Patent Application No. 202011605353.6 are hereby incorporated by reference in their entireties.

BACKGROUND

In an array region structure of a mainstream dynamic random access memory (DRAM), heavily doped polysilicon is usually used as a material for connecting a storage node to an active region. With the continuous miniaturization of feature sizes, smaller apertures impose higher requirements on resistance and parasitic capacitance of a material of a storage node contact structure. As structural sizes decrease, a distance between a storage node contact structure and a bit line and a distance between the storage node contact structure and a word line are further reduced, resulting in increased parasitic capacitance.

SUMMARY

The disclosure relates to the field of processing process technologies of semiconductor storage nodes, and in particular, to a method for forming a storage node contact structure and a semiconductor structure.

An aspect of embodiments of the disclosure provides a method for forming a storage node contact structure. The method includes steps of: providing a substrate having a surface on which bit line structures are formed, a contact hole being formed between bit line structures; forming a groove at a part, corresponding to an active region, of bottom of the contact hole, an included angle between an axial direction of an opening of the groove and a vertical direction being greater than 0 degree and less than 90 degrees; and growing a silicon crystal from the groove in the contact hole by using an epitaxial growth process, and controlling growth rates of the silicon crystal in a first direction and a second direction in a growth process, to enable the growth rate of the silicon crystal in the first direction to be greater than the growth rate of the silicon crystal in the second direction at beginning of growth and to enable the growth rate of the silicon crystal in the first direction to be equal to the growth rate of the silicon crystal in the second direction at end of the growth, thereby separately forming gaps between the silicon crystal and side walls of both bit line structures in the second direction, where the first direction is the axial direction of the opening of the groove, and the second direction is perpendicular to the first direction in a vertical plane.

Another aspect of the embodiments of the disclosure provides a semiconductor structure. The semiconductor structure includes a substrate having a surface on which bit line structures are formed, a contact hole is formed between bit line structures, a groove is formed at a part, corresponding to an active region, of bottom of the contact hole, an included angle between an axial direction of an opening of the groove and a vertical direction is greater than 0 degree and less than 90 degrees; and a silicon crystal is formed in the contact hole, gaps are separately formed between the silicon crystal and side walls of both bit line structures in a second direction, the second direction is perpendicular to the axial direction of the opening of the groove in a vertical plane.

DETAILED DESCRIPTION

Figure 1:
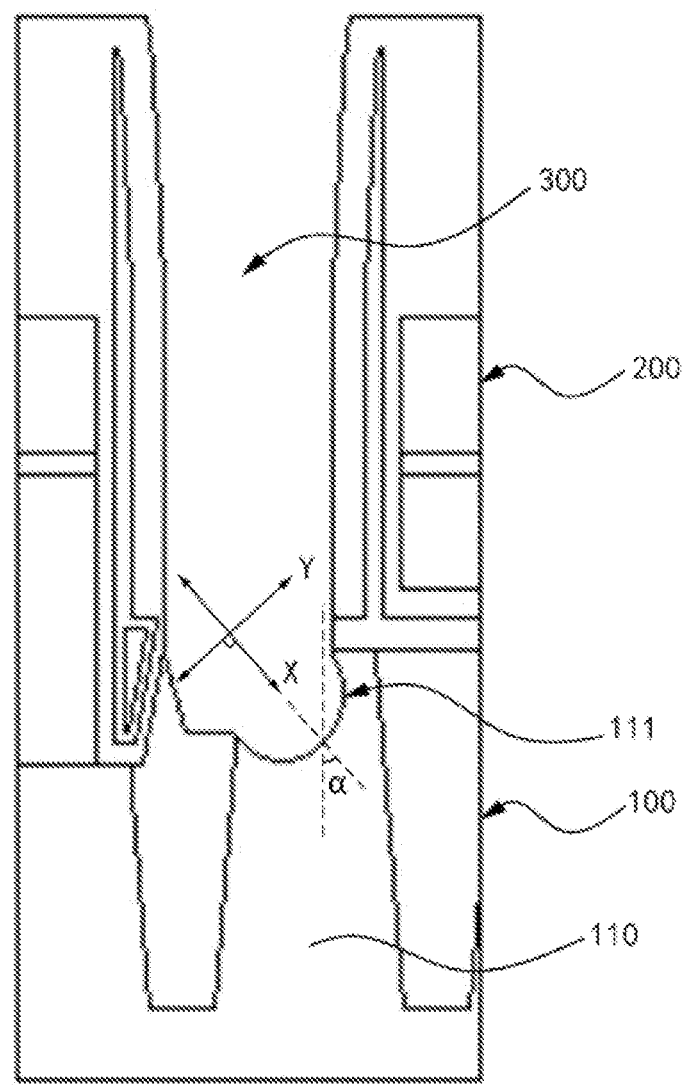
FIG. 1 and FIG. 2 are schematic structural diagrams of a semiconductor structure in respective steps of a method for forming a storage node contact structure according to an exemplary embodiment.

Now exemplary embodiments will be described more fully with reference to the accompanying drawings. However, the example embodiments can be implemented in various ways and shall not be construed as limited to the embodiments set forth herein; rather, these embodiments are provided to make the disclosure comprehensive and complete, and fully convey the concept of the exemplary embodiments to those skilled in the art. Like reference numerals through the drawings denote the same or similar structures, and thus their detailed description will be omitted.

First Embodiment of a Method for Forming a Storage Node Contact Structure

Figure 2:
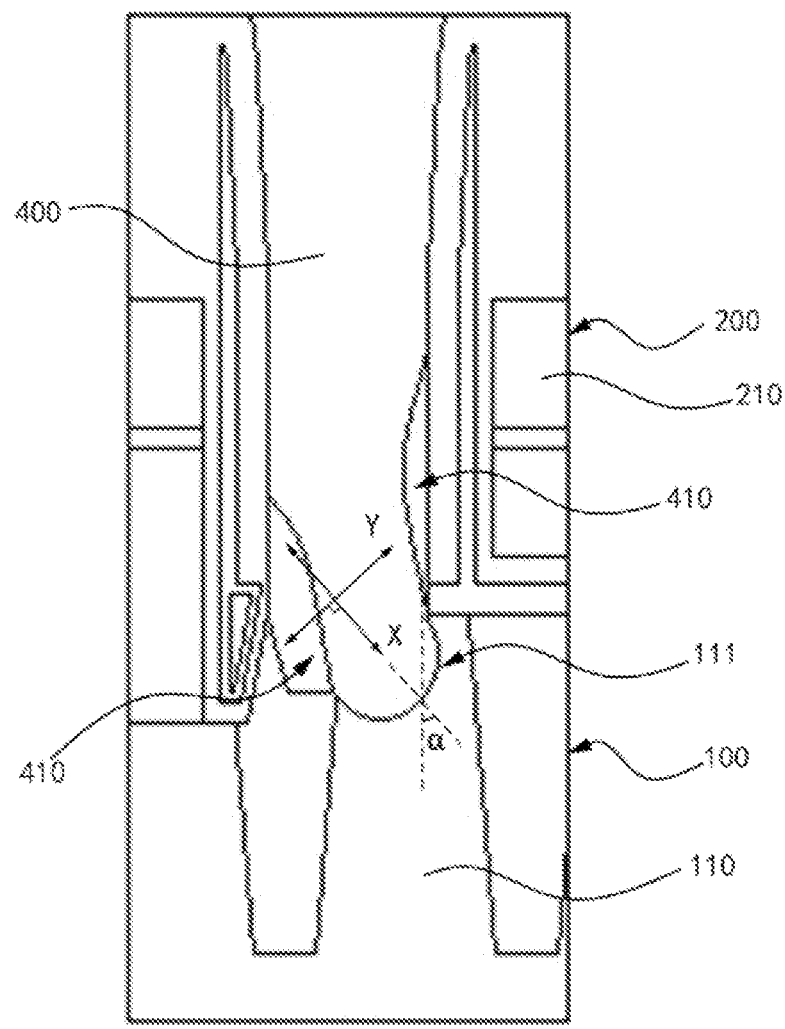

FIG. 1 and FIG. 2 are schematic structural diagrams of a semiconductor structure in steps of a method for forming a storage node contact structure according to the disclosure. In an exemplary embodiment, the method for forming a storage node contact structure provided in the disclosure is described by using an example in which the method is applied to a storage node of a DRAM device. A person skilled in the art may easily understand that to apply related design in the disclosure to other types of semiconductor structures or other processes, various variations, additions, replacements, deletions or other changes are made to the following specific embodiments. These changes still fall within the scope of the principle of the method for forming a storage node contact structure provided in the disclosure.

In this embodiment, the method for forming a storage node contact structure provided in the disclosure includes steps of:

providing a substrate 100, bit line structures 200 being formed on a surface of the substrate 100, a contact hole 300 being formed between bit line structures 200;

forming a groove 111 at a part, corresponding to an active region 110, of bottom of the contact hole 300, there being an included angle α greater than 0 degree and less than 90 degrees between an axial direction of an opening of the groove 111 and a vertical direction; and growing a silicon crystal 400 from the groove 111 in the contact hole 300 by using an epitaxial growth process, and controlling growth rates of the silicon crystal 400 in a first direction X and a second direction Y in a growth process, to enable the growth rate of the silicon crystal 400 in the first direction X to be greater than the growth rate of the silicon crystal 400 in the second direction Y at the beginning of growth and enable the growth rate of the silicon crystal 400 in the first direction X to be equal to the growth rate of the silicon crystal 400 in the second direction Y at the end of the growth, thereby separately forming gaps 410 between the silicon crystal 400 and side walls of the bit line structures 200 on two sides in the second direction Y.

Here, the first direction X is the axial direction of the opening of the groove 111, and the second direction Y is perpendicular to the first direction X in a vertical plane.

By means of the foregoing design, the disclosure can reduce resistance of a storage node contact structure and reduce parasitic capacitance between the storage node contact structure and bit line structures.

FIG. 1 is a schematic structural diagram of the semiconductor structure in the step of "forming a groove 111". In the step, the semiconductor structure includes the substrate 100, the bit line structures 200, and the contact hole 300. Specifically, the active region 110 is formed in the substrate 100. The bit line structures 200 are formed on the surface of the substrate 100. The contact hole 300 is formed between two adjacent bit line structures 200. The groove 111 is formed at the part, corresponding to the active region 110, of the via bottom of the contact hole 300.

FIG. 2 is a schematic structural diagram of the semiconductor structure in the step of "growing a silicon crystal 400". In the step, the semiconductor structure includes the substrate 100, the bit line structures 200, the contact hole 300, and the silicon crystal 400. Specifically, the silicon crystal 400 starts to grow from the groove 111. The growth rate of the silicon crystal 400 in the first direction X is greater than the growth rate of the silicon crystal 400 in the second direction Y, thereby forming the gaps 410 between the silicon crystal 400 and side surfaces of the bit line structures on the two sides. Specifically, in the disclosure, selectivity (for example, an inhibitor such as hydrochloric acid (HCl)) is added to maintain a growth characteristic of a high growth rate (the growth rate in the first direction X is greater than the growth rate in the second direction Y) of monocrystalline silicon in the first direction X, to enable monocrystalline silicon to epitaxially grow to touch the side walls of the bit line structures 200. After the growth is inhibited in the first direction X, monocrystalline silicon grows in the second direction Y and forms seals with the side walls of the bit line structures 200, to eventually form the gaps 410 in the two regions. In the disclosure, the epitaxially grown monocrystalline silicon is used as a material of the storage node contact structure. An epitaxial growth characteristic of monocrystalline silicon is utilized. A growth rate in a specific crystallographic direction (the first direction X) is controlled to form the gaps 410 from the bit line structures in the contact structure, thereby reducing a contact resistance value and reducing parasitic capacitance.

Optionally, in this embodiment, in the growth process of the silicon crystal 400, the growth rates of the silicon crystal 400 in the first direction X and in the second direction Y may be controlled by adding an inhibitor and controlling a content of the inhibitor. An addition content of the inhibitor is negatively correlated to an epitaxial growth nucleation rate of the silicon crystal 400. Based on this, the addition content of the inhibitor at end of the growth is less than the addition content of the inhibitor at beginning of growth.

Figure 6:
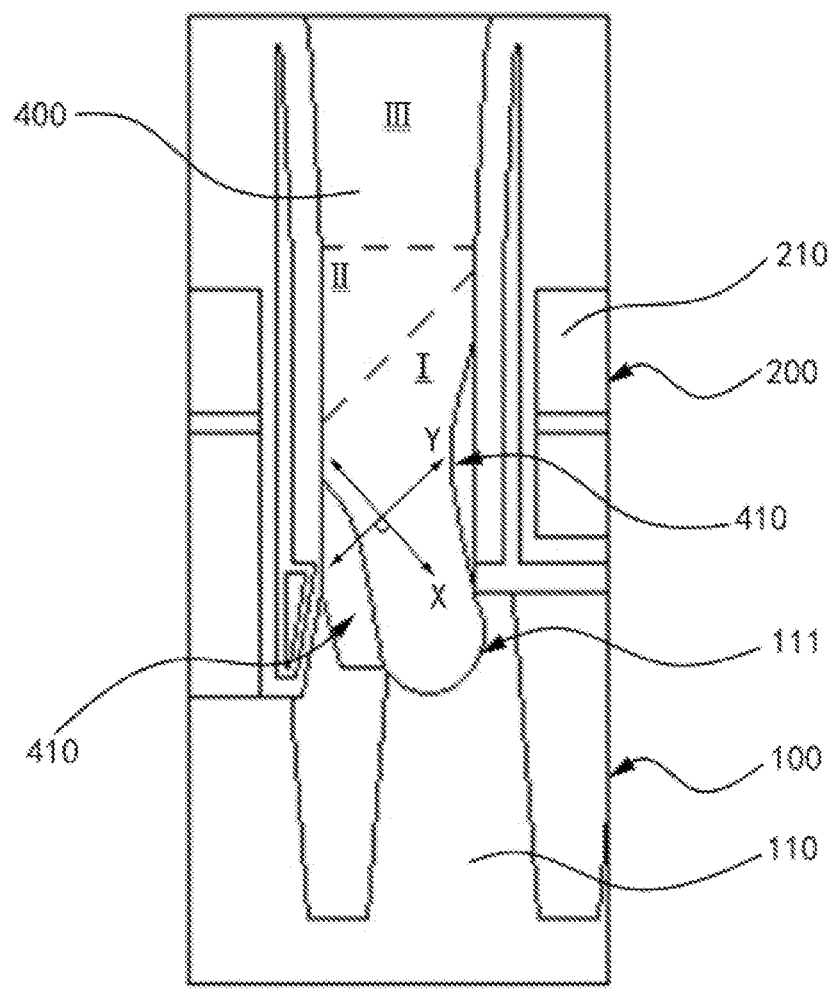
Figure 7:
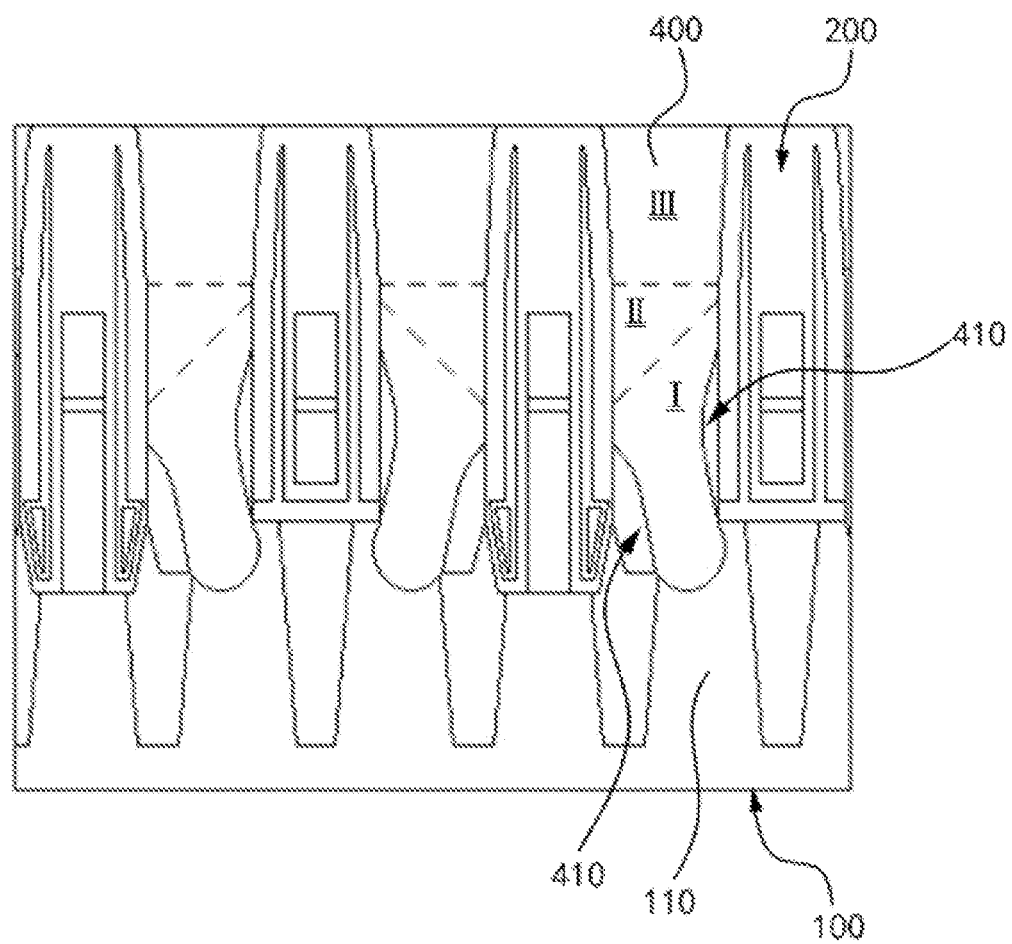
FIG. 7 is a schematic structural diagram of the semiconductor structure formed by using the method for forming a storage node contact structure shown in FIG. 4 to FIG. 6.
Figure 8:
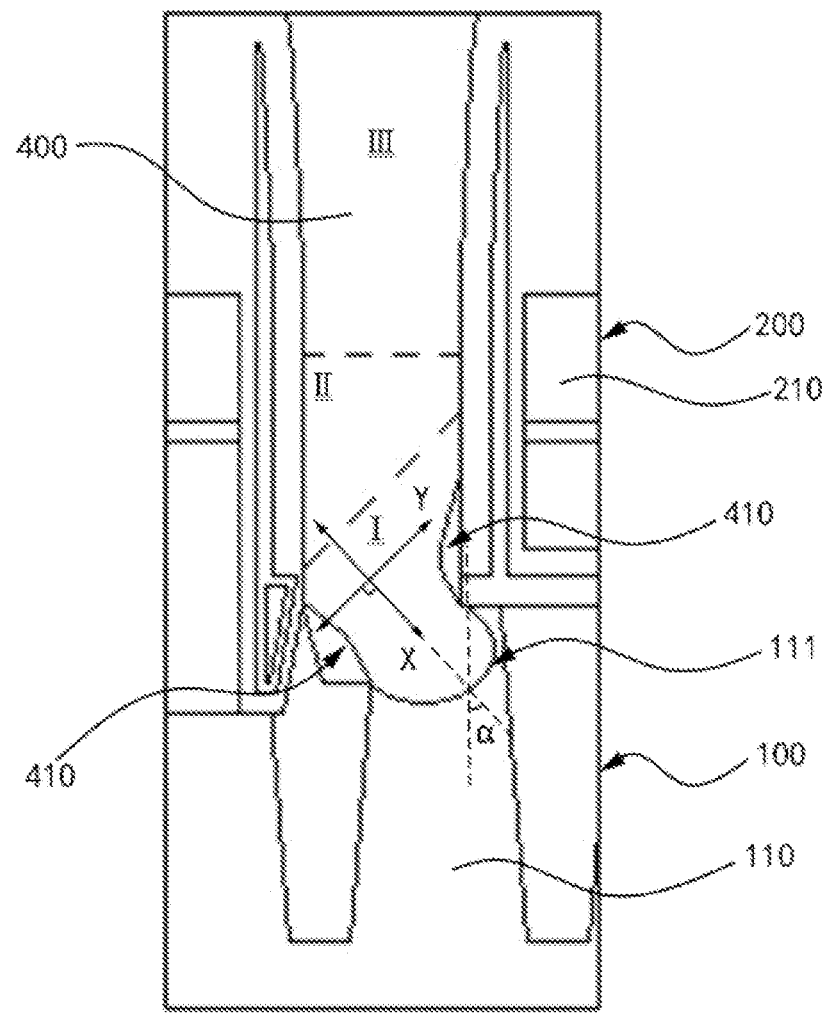
FIG. 8 is a schematic structural diagram of a semiconductor structure in a step of a method for forming a storage node contact structure according to still another exemplary embodiment.

Optionally, as shown in FIG. 6 to FIG. 8, in this embodiment, the included angle α between the axial direction (that is, the first direction X) of the opening of the groove 111 and the vertical direction may be 30° to 60°, for example, 30°, 45°, 50°, 60° or the like. In another embodiment, the included angle α between the axial direction of the opening of the groove 111 and the vertical direction may be less than 30° or may be greater than 60°, for example, 29°, 61° or the like. This embodiment is not limited thereto.

Further, the morphology of the gaps 410 formed between the silicon crystal 400 and the bit line structures 200 may be adjusted by adjusting an opening shape of the groove 111, for example, the axial direction of the groove opening and controlling the addition content of the inhibitor. Based on this, as shown in FIG. 6 to FIG. 8, in this embodiment, a height of the gaps 410 may be greater than or equal to a height of a metal layer 210 (for example, tungsten, W) in the bit line structures 200.

Second Embodiment of a Method for Forming a Storage Node Contact Structure

Based on the foregoing detailed description of the exemplary embodiment of the method for forming a storage node contact structure provided in the disclosure, another exemplary embodiment of the method for forming a storage node contact structure provided in the disclosure is described below with reference to FIG. 4 to FIG. 6.

Figure 4:
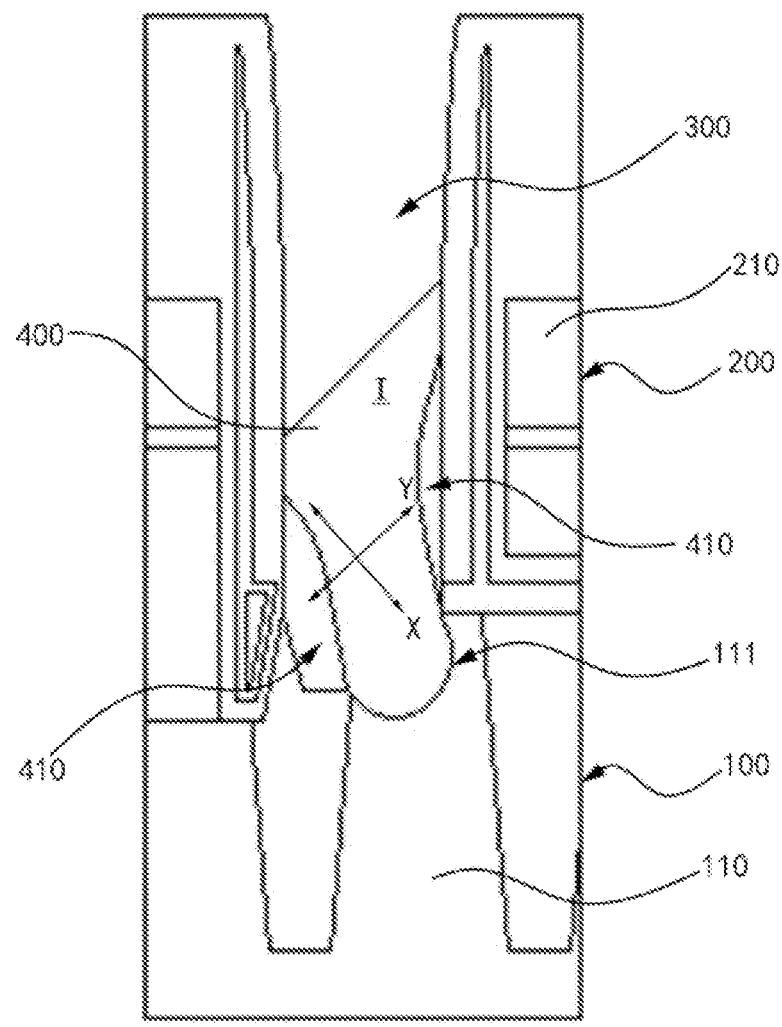
FIGS. 4 to 6 are schematic structural diagrams of a semiconductor structure in respective steps of a method for forming a storage node contact structure according to another exemplary embodiment.
Figure 5:
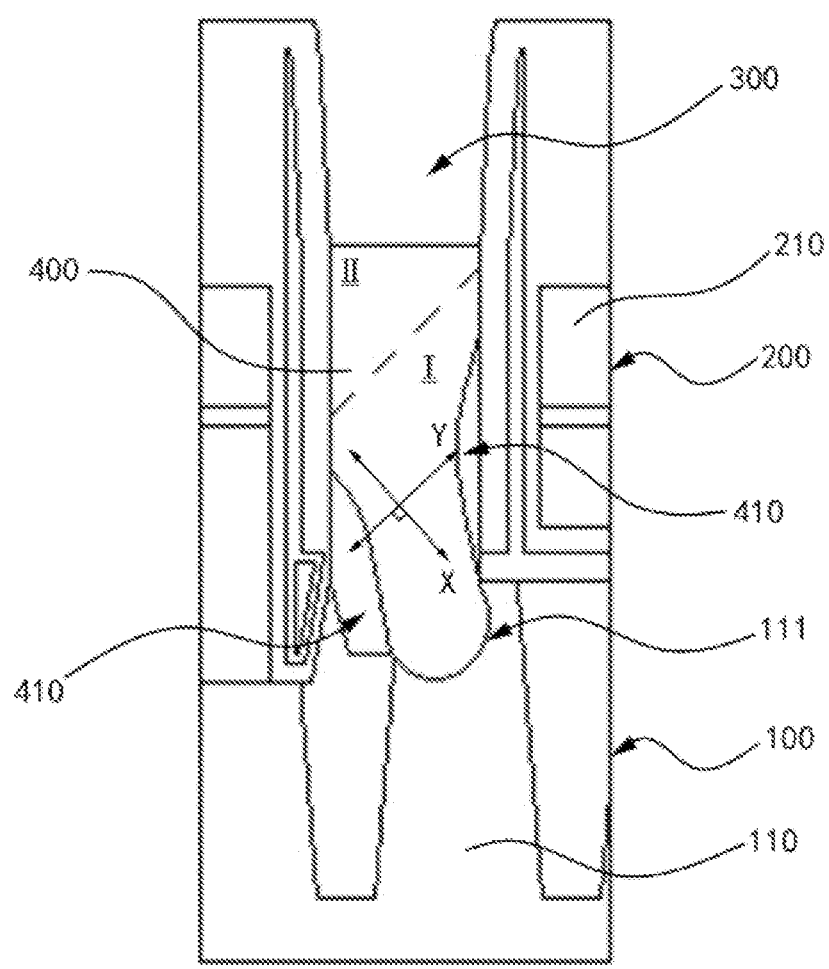

FIG. 4 to FIG. 6 are schematic structural diagrams of a semiconductor structure in steps of a method for forming a storage node contact structure according to the disclosure. In an exemplary embodiment, the method for forming a storage node contact structure provided in the disclosure is approximately the same as a process design in the foregoing first embodiment. Main differences between this embodiment and the foregoing first embodiment are described below.

As shown in FIG. 4 to FIG. 6, in this embodiment, the growth process of the silicon crystal 400 may include a plurality of growth stages. Based on this, the addition content of the inhibitor may gradually decrease in these growth stages. The so-called "gradually decrease" may be understood as that regardless of whether the addition content of the inhibitor in any growth stage is a constant value or a variable value, the smallest value of the addition content of the inhibitor in one growth stage is greater than or equal to the largest value of the addition content of the inhibitor in a previous growth stage and is less than or equal to the smallest value of the addition content of the inhibitor in a next growth stage. In another embodiment, the growth process of the silicon crystal 400 may be one growth stage. The addition content of the inhibitor may gradually decrease in the growth stages.

Further, in this embodiment, in the growth process of the silicon crystal 400, the addition content of the inhibitor at end of the growth may be 0 or may be not 0. In other words, in the growth process of the silicon crystal 400, the addition content of the inhibitor at beginning of growth gradually decreases to 0 through the growth process or gradually decreases to another addition content.

Further, based on a process design in which the growth process of the silicon crystal 400 includes a plurality of growth stages, in this embodiment, the growth process of the silicon crystal 400 may sequentially include a first growth stage, a second growth stage, and a third growth stage. The addition content of the inhibitor in the first growth stage is constantly a first content. The addition content of the inhibitor in the second growth stage gradually decreases within a content range. The addition content of the inhibitor in the third growth stage is constantly a third content. The first content is greater than or equal to the upper limit of the content range. The lower limit of the content range is greater than or equal to the third content. In another embodiment, the addition content of the inhibitor in the first growth stage or the second growth stage may gradually decrease to form a content range. This embodiment is not limited thereto.

FIG. 4 is a schematic structural diagram of the semiconductor structure in "the first growth stage of the silicon crystal 400". In the step, the semiconductor structure includes the substrate 100, the bit line structures 200, the contact hole 300, and a first region I of the silicon crystal 400 grown in the first growth stage. Specifically, the silicon crystal 400 in the first region I is grown in the contact hole 300, and starts to grow from the groove 111. In the growth process of the silicon crystal 400 in the first region I, the addition of a high content of the inhibitor enables the growth rate of the silicon crystal 400 in the first direction X to be greater than the growth rate of the silicon crystal 400 in the second direction Y, thereby separately forming the gaps 410 between the silicon crystal 400 and the bit line structures 200 on the two sides in the first direction X.

Further, for the first growth stage of the silicon crystal 400, an inhibitor including HCl is used as an example, and a flow rate of HCl is used to represent the addition content of the inhibitor. A first flow rate (that is, the first content) may be a constant value between 175 sccm and 185 sccm, for example, 175 sccm, 180 sccm, 185 sccm or the like. In another embodiment, the first flow rate of HCl in the first growth stage may be less than 175 sccm or may be greater than 185 sccm, for example, 174 sccm, 187 sccm or the like. This embodiment is not limited thereto.

FIG. 5 is a schematic structural diagram of the semiconductor structure in "the second growth stage of the silicon crystal 400". In the step, the semiconductor structure includes the substrate 100, the bit line structures 200, the contact hole 300, and the first region I and a second region II of the silicon crystal 400 that are respectively grown in the first growth stage and the second growth stage. Specifically, the silicon crystal 400 in the second region II is grown in the contact hole 300, and grows upward from the top of the first region I. In the growth process of the silicon crystal 400 in the second region II, the addition content of the inhibitor gradually decreases, to enable the growth rate of the silicon crystal 400 in the first direction X to approximate the growth rate of the silicon crystal 400 in the second direction Y.

Further, for the second growth stage of the silicon crystal 400, an inhibitor including HCl is used as an example, and a flow rate of HCl represents the addition content of the inhibitor. The upper limit of a flow rate range (that is, the content range) may be 130 sccm to 140 sccm, for example, 130 sccm, 135 sccm, 140 sccm or the like, and the lower limit of the flow rate range may be 85 sccm to 95 sccm, for example, 85 sccm, 90 sccm, 95 sccm or the like. In another embodiment, the upper limit of the flow rate range of HCl in the second growth stage may be less than 130 sccm or may be greater than 140 sccm, for example, 129 sccm, 142 sccm or the like, and the lower limit of the flow rate range of HCl in the second growth stage may be less than 85 sccm or may be greater than 95 sccm, for example, 84 sccm, 97 sccm or the like. This embodiment is not limited thereto.

FIG. 6 is a schematic structural diagram of the semiconductor structure in "the third growth stage of the silicon crystal 400". In the step, the semiconductor structure includes the substrate 100, the bit line structures 200, the contact hole 300, and the first region I, the second region II, and a third region III of the silicon crystal 400 that are respectively grown in the first growth stage, the second growth stage, and the third growth stage. Specifically, the silicon crystal 400 in the third region III is grown in the contact hole 300, and grows upward from the top of the second region II. In the growth process of the silicon crystal 400 in the third region III, the addition of a low content of the inhibitor enables the growth rate of the silicon crystal 400 in the first direction X to be equal to the growth rate of the silicon crystal 400 in the second direction Y.

Further, for the third growth stage of the silicon crystal 400, an inhibitor including HCl is used as an example, and a flow rate of HCl represents the addition content of the inhibitor. A third flow rate (that is, the third content) may be a constant value between 40 sccm and 50 sccm, for example, 40 sccm, 45 sccm, 50 sccm or the like. In another embodiment, the third flow rate of HCl in the third growth stage may be less than 40 sccm or may be greater than 50 sccm, for example, 38 sccm, 51 sccm or the like. This embodiment is not limited thereto. In another embodiment, the flow rate of HCl in the third growth stage may gradually decrease to form a flow rate range or may gradually decrease to 0 to form a flow rate range or may be 0.

Further, an inhibitor including HCl is used as an example, and a flow rate of HCl represents the addition content of the inhibitor. The first flow rate (that is, the first content) of HCl may be 180 sccm. The flow rate range (that is, the content range) of HCl may be 90 sccm to 135 sccm. The third flow rate (that is, the third content) of HCl may be 45 sccm.

Third Embodiment of a Method for Forming a Storage Node Contact Structure

Based on the foregoing detailed description of the two exemplary embodiments of the method for forming a storage node contact structure provided in the disclosure, another exemplary embodiment of the method for forming a storage node contact structure provided in the disclosure is described below.

In this embodiment, a process design of the method for forming a storage node contact structure provided in the disclosure is approximately the same as those in the foregoing first and second embodiments. Main differences between this embodiment and the foregoing first and second embodiments are described below.

In this embodiment, a doping source may be added to the growth process of the silicon crystal 400. A doping concentration of the doping source at end of the growth is greater than a doping concentration of the doping source at beginning of growth, to form in the contact hole 300 a silicon crystal gradient structure transitioning from monocrystalline silicon to heavily doped polysilicon. By means of the foregoing design, the disclosure can reduce parasitic capacitance between the storage node contact structure and bit line structures, thereby improving the manufacturing process efficiency of the contact structure and reducing production costs.

Optionally, in this embodiment, the growth process of the silicon crystal 400 may include a plurality of growth stages. Based on this, the doping concentration of the doping source may gradually decrease in these growth stages. The so-called "gradually decrease" may be understood as that regardless of whether the doping concentration of the doping source in any growth stage is a constant value or a variable value, the smallest value of the doping concentration of the doping source in one growth stage is greater than or equal to the largest value of the doping concentration of the doping source in a previous growth stage, and is less than or equal to the smallest value of the doping concentration of the doping source in a next growth stage. In another embodiment, the growth process of the silicon crystal 400 may be one growth stage, and the doping concentration of the doping source may gradually decrease in the growth stages.

Further, based on a process design in which the growth process of the silicon crystal 400 includes a plurality of growth stages, in this embodiment, the doping concentration of the doping source in any growth stage may be constant. Based on this, the doping concentration of the doping source in any growth stage is greater than the doping concentration of the doping source in a previous growth stage and is less than the doping concentration of the doping source in a next growth stage.

It is to be noted that, in another embodiment, regardless of whether the growth process of the silicon crystal 400 includes a plurality of growth stages, the doping concentration of the doping source in the growth process may use a gradually decreasing design. That is, in the growth process of the silicon crystal 400, the doping concentration of the doping source at any moment is greater than the doping concentration of the doping source at a previous moment. This embodiment is not limited thereto.

Further, based on a process design in which the doping concentration of the doping source is constant in all growth stages of the silicon crystal 400, in this embodiment, the growth process of the silicon crystal 400 may sequentially include a first growth stage, a second growth stage, and a third growth stage. The doping concentration of the doping source in the first growth stage is constantly a first concentration. The doping concentration of the doping source in the second growth stage is constantly a second concentration. The doping concentration of the doping source in the third growth stage is constantly a third concentration. Based on this, the first concentration is less than the second concentration, and the second concentration is less than the third concentration.

Further, as shown in FIG. 4 to FIG. 6, in this embodiment, a process design in which the doping concentration of the doping source changes in three growth stages may correspond to the process design in which the addition content of the inhibitor changes in three growth stages in the second embodiment.

FIG. 4 is a schematic structural diagram of the semiconductor structure in "the first growth stage of the silicon crystal 400". In the step, the semiconductor structure includes the substrate 100, the bit line structures 200, the contact hole 300, and the first region I of the silicon crystal 400 grown in the first growth stage. Specifically, the silicon crystal 400 in the first region I is grown in the contact hole 300, and grows upward from the via bottom of the contact hole 300. In the first growth stage, the doping source may be turned off when the stage starts, to promote the formation of an undoped monocrystalline epitaxial growth layer, thereby ensuring the stability of epitaxial growth of monocrystalline silicon. Subsequently, the doping source may be turned on, and the doping concentration of the doping source is controlled to be constantly the first concentration, to form doped monocrystalline silicon. In addition, through the diffusion of the doping source, a doping concentration of monocrystalline silicon at an interface is increased, thereby obtaining the first region I with low resistance (including bulk phase resistance and interface resistance).

Further, for the first growth stage of the silicon crystal 400, a doping source including phosphorus (P) is used as an example. The first concentration may be a constant value between $7E+20/cm^3$ and $8E+20/cm^3$, for example, $7E+20/cm^3$, $7.5E+20/cm^3$, $8E+20/cm^3$ or the like. In another embodiment, the first concentration of the doping source in the first growth stage may be less than $7E+20/cm^3$, or may be greater than $8E+20/cm^3$, for example, $6.9E+20/cm^3$, $8.2E+20/cm^3$ or the like. This embodiment is not limited thereto.

FIG. 5 is a schematic structural diagram of the semiconductor structure in "the second growth stage of the silicon crystal 400". In the step, the semiconductor structure includes the substrate 100, the bit line structures 200, the contact hole 300, and the first region I and the second region II of the silicon crystal 400 that are respectively grown in the first growth stage and the second growth stage. Specifically, the silicon crystal 400 in the second region II is grown in the contact hole 300, and grows upward from the top of the first region I.

Further, for the second growth stage of the silicon crystal 400, a doping source including P is used as an example. The second concentration may be a constant value between $8.5E+20/cm^3$ and $9.5E+20/cm^3$, for example, $8.5E+20/cm^3$, $9E+20/cm^3$, $9.5E+20/cm^3$ or the like. In another embodiment, the second concentration of the doping source in the second growth stage may be less than $8.5E+20/cm^3$, or may be greater than $9.5E+20/cm^3$, for example, $8.4E+20/cm^3$, $9.7E+20/cm^3$ or the like. This embodiment is not limited thereto.

FIG. 6 is a schematic structural diagram of the semiconductor structure in "the third growth stage of the silicon crystal 400". In the step, the semiconductor structure includes the substrate 100, the bit line structures 200, the contact hole 300, and the first region I, the second region II, and the third region III of the silicon crystal 400 that are respectively grown in the first, second, and third growth stages. Specifically, the silicon crystal 400 in the third region III is grown in the contact hole 300, and grows upward from the top of the second region II. In the third growth stage, because the doping concentration of the doping source continues to increase, the silicon crystal 400 gradually forms heavily doped polysilicon in the third region III, thereby increasing a growth rate and growth uniformity.

Further, for the third growth stage of the silicon crystal 400, a doping source including P is used as an example. The third concentration may be a constant value between $1E+21/cm^3$ and $1.1E+21/cm^3$, for example, $1E+21/cm^3$, $1.05E+21/cm^3$, $1.1E+21/cm^3$ or the like. In another embodiment, the third concentration of the doping source in the third growth stage may be less than $1E+21/cm^3$, or may be greater than $1.1E+21/cm^3$, for example, $0.99E+21/cm^3$, $1.12E+21/cm^3$ or the like. This embodiment is not limited thereto.

Further, based on a process design in which the growth process of the silicon crystal 400 includes three growth stages, a doping source including P is used as an example.

The first concentration may be $7.5E+20/cm^3$, the second concentration may be $9E+20/cm^3$, and the third concentration may be $1.05E+21/cm^3$.

It is to be noted that, as shown in FIG. 4 to FIG. 6, the three growth stages of the silicon crystal 400 in the growth process in this embodiment may respectively correspond to the three growth stages of the silicon crystal 400 in the growth process in the second embodiment. Based on this, the process design in which the doping concentration of the doping source changes in three growth stages in this embodiment may correspond to the process design in which the addition content of the inhibitor changes in three growth stages in the first embodiment. In other words, in this embodiment, a change trend of the doping concentration of the doping source may have a positive correlation with a change trend of the addition content of the inhibitor. However, in the entire growth process of the silicon crystal 400, it is not limited that change nodes of the doping concentration of the doping source completely coincide with change nodes of the addition content of the inhibitor.

It is to be understood that in the embodiments that conform to the design concept of the storage node contact structure provided in the disclosure, the growth process of the silicon crystal 400 may include another quantity of growth stages, or may be one complete process. Nevertheless, a change design of the addition content of the inhibitor is not affected by the change design of the doping concentration of the doping source, and the doping concentration of the doping source may not change.

Fourth Embodiment of a Method for Forming a Storage Node Contact Structure

Based on the foregoing detailed description of the three exemplary embodiments of the method for forming a storage node contact structure provided in the disclosure, another exemplary embodiment of the method for forming a storage node contact structure provided in the disclosure is described below with reference to FIG. 8.

FIG. 8 is a schematic structural diagram of a semiconductor structure in a step of the method for forming a storage node contact structure provided according to the disclosure. In an exemplary embodiment, the method for forming a storage node contact structure provided in the disclosure is approximately the same as those in the process designs in the foregoing second and third embodiments. Main differences between this embodiment and the foregoing second and third embodiments are described below.

As shown in FIG. 8, in this embodiment, the included angle α between the axial direction (that is, the first direction X) of the opening of the groove 111 and the vertical direction is greater than the included angle α in the second and third embodiments. Based on this, a height of the gaps 410 formed by the silicon crystal 400 starting to grow from the groove 111 is less than a height of the gaps 410 in the second and third embodiments. Based on this, the morphology of the gaps 410 formed between the silicon crystal 400 and the bit line structures 200 may be adjusted by adjusting an opening shape of the groove 111, for example, the axial direction of the groove opening.

Based on the foregoing detailed description of the several exemplary embodiments of the method for forming a storage node contact structure provided in the disclosure, an exemplary embodiment of the semiconductor structure provided in the disclosure is described below with reference to FIG. 3 or FIG. 7.

Figure 3:
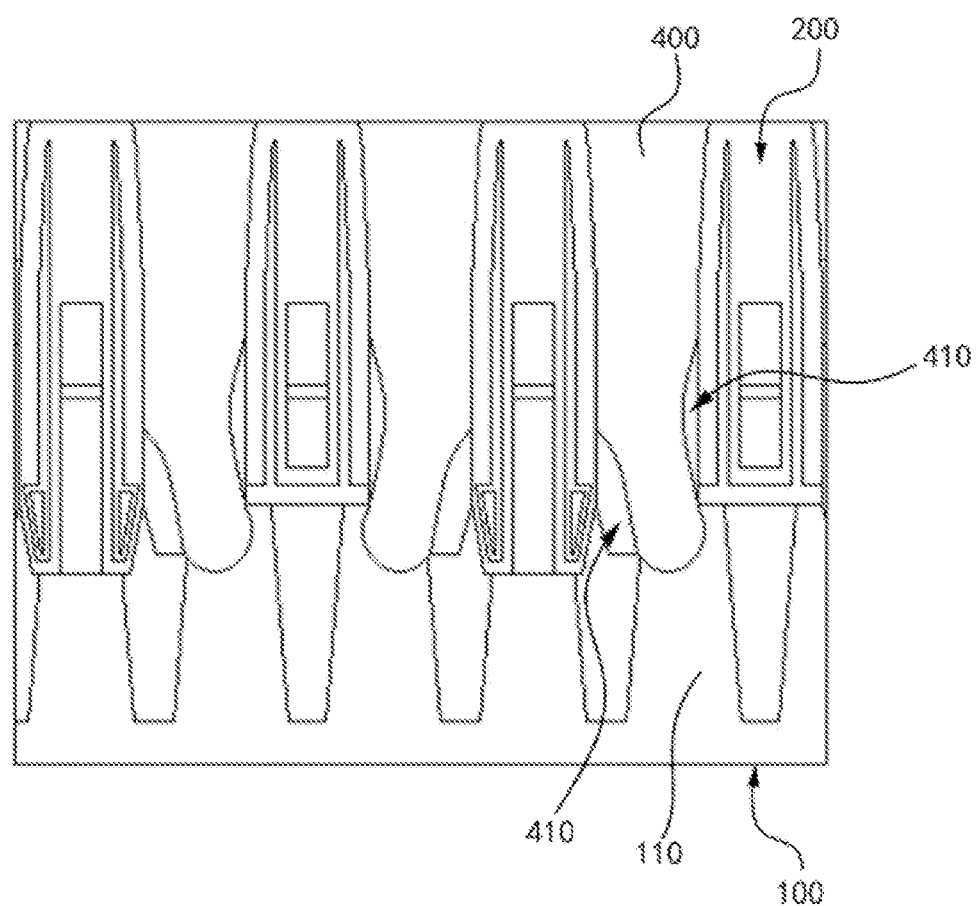
FIG. 3 is a schematic structural diagram of the semiconductor structure formed by using the method for forming a storage node contact structure shown in FIG. 1 and FIG. 2.

As shown in FIG. 3 or FIG. 7, in this embodiment, the semiconductor structure provided in the disclosure includes the substrate 100. The bit line structures 200 being formed on the surface of the substrate 100. The contact hole 300 is formed between bit line structures 200. The groove 111 is formed at the part, corresponding to the active region 110, of the via bottom of the contact hole 300. There is the included angle α greater than 0 degree and less than 90 degrees between the axial direction (that is, the first direction X) of the opening of the groove 111 and the vertical direction. Based on this, the silicon crystal 400 is formed in the contact hole 300, The gaps 410 are separately formed between the silicon crystal 400 and the side walls of the bit line structures 200 on the two sides in the second direction Y. The second direction Y is perpendicular to the axial direction of the opening of the groove 111 in a vertical plane. By means of the foregoing design, the disclosure can reduce resistance of the storage node contact structure and reduce parasitic capacitance between the storage node contact structure and bit line structures.

Optionally, in this embodiment, the silicon crystal 400 may be used as a storage node contact structure.

Optionally, in this embodiment, the silicon crystal 400 may include a silicon crystal gradient structure transitioning from monocrystalline silicon to heavily doped polysilicon.

Optionally, in this embodiment, the silicon crystal gradient structure may include a first region I, a second region II, and a third region III. Specifically, there may be monocrystalline silicon in the first region I, there may be a transition from monocrystalline silicon to polysilicon in the second region II, and there may be polysilicon (for example, heavily doped polysilicon) in the third region III. Based on this, a doping concentration in the first region I may be $7E+20/cm^3$ to $8E+20/cm^3$, a doping concentration in the second region II may be $8.5E+20/cm^3$ to $9.5E+20/cm^3$, and a doping concentration in the third region III may be $1E+21/cm^3$ to $1.1E+21/cm^3$.

As described above, in the disclosure, growth rates of a silicon crystal in a first direction and a second direction are controlled in a growth process of the silicon crystal, thereby separately forming gaps between the silicon crystal and side walls of both bit line structures in the second direction. By means of the foregoing design, the disclosure can reduce resistance of the storage node contact structure and reduce parasitic capacitance between the storage node contact structure and bit line structures.

Although the disclosure has been described with reference to several typical embodiments, it is to be understood that the used terms are descriptive and exemplary rather than limitative terms. Because the disclosure can be specifically implemented in various forms without departing from the spirit or essence of the disclosure. It is to be understood that the foregoing embodiments are not limited any foregoing details but should be widely interpreted within the spirit and scope limited by the appended claims. Therefore, all changes and variations that fall within the claims or equivalent scope thereof shall be covered by the appended claims.

The invention claimed is:

1. A method for forming a storage node contact structure, comprising steps of:
   providing a substrate having a surface on which bit line structures are formed, a contact hole being formed between the bit line structures;
   forming a groove at a part, corresponding to an active region, of a bottom of the contact hole, an included angle between an axial direction of an opening of the groove and a vertical direction being greater than 0 degree and less than 90 degrees; and growing a silicon crystal from the groove in the contact hole by using an epitaxial growth process, and controlling growth rates of the silicon crystal in a first direction and a second direction in a growth process, to enable the growth rate of the silicon crystal in the first direction to be greater than the growth rate of the silicon crystal in the second direction at a beginning of growth, and to enable the growth rate of the silicon crystal in the first direction to be equal to the growth rate of the silicon crystal in the second direction at an end of the growth, thereby separately forming gaps between the silicon crystal and side walls of both the bit line structures in the second direction, wherein the first direction is the axial direction of the opening of the groove, and the second direction is perpendicular to the first direction in a vertical plane.

2. The method for forming a storage node contact structure of claim 1, wherein in the growth process of the silicon crystal, the growth rates of the silicon crystal in the first direction and the second direction are controlled by adding an inhibitor and controlling a content of the inhibitor, an addition content of the inhibitor is negatively correlated to an epitaxial growth nucleation rate of the silicon crystal, and the addition content of the inhibitor at the end of the growth is less than the addition content of the inhibitor at the beginning of the growth.

3. The method for forming a storage node contact structure of claim 2, wherein the addition content of the inhibitor at end of the growth is 0.

4. The method for forming a storage node contact structure of claim 2, wherein the growth process of the silicon crystal comprises a plurality of growth stages, and the addition content of the inhibitor gradually decreases in the plurality of growth stages.

5. The method for forming a storage node contact structure of claim 4, wherein the growth process of the silicon crystal sequentially comprises a first growth stage, a second growth stage, and a third growth stage, the addition content of the inhibitor in the first growth stage is constantly a first content, the addition content of the inhibitor in the second growth stage gradually decreases within a content range, the addition content of the inhibitor in the third growth stage is constantly a third content, the first content is greater than or equal to an upper limit of the content range, and a lower limit of the content range is greater than or equal to the third content.

6. The method for forming a storage node contact structure of claim 5, wherein the inhibitor comprises hydrochloric acid (HCl), a flow rate of the HCl represents the addition content of the inhibitor, the first content is 175 sccm to 185 sccm, the upper limit of the content range is 130 sccm to 140 sccm, the lower limit of the content range is 85 sccm to 95 sccm, and the third content is 40 sccm to 50 sccm.

7. The method for forming a storage node contact structure of claim 6, wherein the first content is 180 sccm.

8. The method for forming a storage node contact structure of claim 6, wherein the upper limit of the content range is 135 sccm, and the lower limit of the content range is 90 sccm.

9. The method for forming a storage node contact structure of claim 6, wherein the third content is 45 sccm.

10. The method for forming a storage node contact structure of claim 1, wherein during the growth of the silicon crystal, a doping source is added in the growth process, and a doping concentration of the doping source at the end of the growth is greater than the doping concentration of the doping source at the beginning of the growth, to form in the contact hole a silicon crystal gradient structure transitioning from monocrystalline silicon to heavily doped polysilicon.

11. The method for forming a storage node contact structure of claim 10, wherein the growth process of the silicon crystal comprises a plurality of growth stages, and the doping concentration of the doping source gradually decreases in the plurality of growth stages.

12. The method for forming a storage node contact structure of claim 11, wherein the doping concentration of the doping source in each of the plurality of growth stage is constant.

13. The method for forming a storage node contact structure of claim 12, wherein the growth process of the silicon crystal sequentially comprises a first growth stage, a second growth stage, and a third growth stage, the doping concentration of the doping source in the first growth stage is constantly a first concentration, the doping concentration of the doping source in the second growth stage is constantly a second concentration, the doping concentration of the doping source in the third growth stage is constantly a third concentration, the first concentration is less than the second concentration, and the second concentration is less than the third concentration.

14. The method for forming a storage node contact structure of claim 13, wherein the doping source comprises phosphorus (P), the first concentration is $7E+20/cm^3$ to $8E+20/cm^3$, the second concentration is $8.5E+20/cm^3$ to $9.5E+20/cm^3$, and the third concentration is $1E+21/cm^3$ to $1.1E+21/cm^3$.

15. The method for forming a storage node contact structure of claim 14, wherein at least one of following applies: the first concentration is $7.5E+20/cm^3$, the second concentration is $9E+20/cm^3$, or the third concentration is $1.05E+21/cm^3$.

16. The method for forming a storage node contact structure of claim 1, wherein a doping concentration of a doping source gradually decreases in the growth process.

* * * * *